United States Patent [19]

Feuerbaum

[11] Patent Number: 4,733,176

[45] Date of Patent: Mar. 22, 1988

[54] METHOD AND APPARATUS FOR LOCATING DEFECTS IN AN ELECTRICAL CIRCUIT WITH A LIGHT BEAM

[75] Inventor: Hans-Peter Feuerbaum, Munich, Fed. Rep. of Germany

[73] Assignee: Siemens Aktiengesellschaft, Berlin and Munich, Fed. Rep. of Germany

[21] Appl. No.: 766,502

[22] Filed: Aug. 19, 1985

[30] Foreign Application Priority Data

Sep. 13, 1984 [DE] Fed. Rep. of Germany ....... 3433650

[51] Int. Cl.$^4$ ............................................. G01R 31/28
[52] U.S. Cl. ............................... 324/158 R; 324/73 R
[58] Field of Search .............. 324/158 R, 158 D, 71.3, 324/73 R; 250/310, 311

[56] References Cited

U.S. PATENT DOCUMENTS

| | | | |
|---|---|---|---|
| 3,628,012 | 12/1971 | Plows | 250/49.5 A |
| 4,220,853 | 9/1980 | Feuerbaum et al. | 250/310 |
| 4,277,679 | 7/1981 | Feuerbaum | 250/310 |
| 4,407,008 | 9/1983 | Schmidt et al. | 358/93 |

FOREIGN PATENT DOCUMENTS

2069152 8/1981 United Kingdom .

OTHER PUBLICATIONS

Henley, F. J.; "Logic Failure Analysis ... "; IEEE Int. Reliability Physics Symposium; Apr. 1984.
322 Microelectronics and Reliability, vol. 22 (1982) No. 2, Oxford, Great Britain, "The Application of Marginal Voltage Measurements to Detect and Locate Defects in Digital Microcircuits", by D. J. Ager et al, pp. 241-264.

*Primary Examiner*—Ernest F. Karlsen
*Attorney, Agent, or Firm*—Hill, Van Santen, Steadman & Simpson

[57] ABSTRACT

A method and apparatus for locating defects in an electrical circuit with a light beam. At least one scan point within the electrical circuit is driven with a repeating voltage progression. The light beam disrupts the function of the electrical circuit when scanning by releasing charge carriers at scan points. A voltage at every scan point with which this scan point is driven is varied or held constant. Those weak points which cause the electrical circuit not to achieve a desired specification are located. At every scanning of every scan point, at least one single period of the repeating voltage progression is completed. At every scan point, at least one critical parameter for the desired specification of the electrical circuit is modulated, until the electrical circuit malfunctions.

15 Claims, 7 Drawing Figures

METHOD AND APPARATUS FOR LOCATING DEFECTS IN AN ELECTRICAL CIRCUIT WITH A LIGHT BEAM

BACKGROUND OF THE INVENTION

The invention relates to a method and an apparatus for locating defects in an electrical circuit with a light beam wherein the light beam disrupts a function of the electrical circuit at the scan point by releasing charge carriers.

In defect analysis of integrated circuits, a distinction must be made between causes of defects which are either founded in a defective design, or which can be attributed to technological deficiencies. Electron beam measuring technology works mainly in design optimization. A method and an apparatus for measuring potential at an electronic component with the assistance of electron beam measuring technology is disclosed, for example, in U.S. Pat. No. 4,277,679, incorporated herein by reference. Electron beam measuring technology is less suitable for locating technological defects than locating errors in the design of an electronic component.

So-called "Marginal Voltage Testing" (Microelectronics and Reliability, Vol. 22, No. 2, pages 241-264, 1982, Great Britain, incorporated herein by reference) is employed for defect locating in the inside of integrated circuits (see also British Patent No. 2,069,152). In this method for defect locating, the integrated circuit is driven with a high-frequency voltage wherein voltage pulses periodically repeat. Furthermore, the integrated circuit is scanned line-by-line with a focused laser beam. By releasing charge carriers in that region in which the laser beam impinges the integrated circuit, the laser beam disrupts the electrical function of the integrated circuit. When the laser beam impinges a location in the inside of the integrated circuit which has design and/or technology defects, then the disruption caused by the laser beam can lead to the failure of the logical function of the electrical circuit. The probability for the failure of the logical function of the electrical circuit increases with decreasing operating voltage with which the integrated circuit is operated. For this reason, in the prior art the operating voltage at the integrated circuit at every scan point impinged by the laser beam is lowered until the electrical circuit is non-functional. The lowest possible operating voltage at which the electrical circuit still functions even though the laser beam impinges a scan point within the integrated circuit is therefore a measure for the severity of the defect found at a scan point. The defect found at a scan point is all the more serious the higher the possible operating voltage at which the electrical function just still functions, whereby the electrical circuit becomes just non-functioning given a further lowering of this operating voltage.

SUMMARY OF THE INVENTION

An object of the present invention is to specify a method and an apparatus of the type initially cited with which those weak points can be located which are the cause of the electrical circuit not achieving a desired specification.

This object is achieved by providing during every scanning of at least one scan point that at least one single period of the repeating voltage progression is completed with which this scan point is driven. At every scan point, at least one critical parameter for a defined specification of the electrical circuit is modulated until the electrical circuit malfunctions.

The integrated circuit is advantageously scanned by a focused laser beam. The focused laser beam triggers charge carriers in the inside of the integrated circuit at the scan points. These charge carriers disturb the electrical function of the integrated circuit. In accordance with the invention, the parameters critical for achieving a specific specification are modulated individually or in combination such that, at every scan point impinged by the laser beam, a repeating voltage progression at this scan point is completely traversed at least once. Thus, the critical parameter is advantageously substantially not modified during a single pass of this repeating voltage progression. In order to be able to accelerate a measurement, the modulation of a critical parameter across a defined modulation range should occur as quickly as possible. For this reason, the critical parameter can also be modified during a single pass of the repeating voltage progression, insofar as this modification is so small that the severity of the defect at a specific scan point can be allocated to a specific range of a critical parameter. As long as a weak point can be localized with sufficient precision, a critical parameter or a plurality of critical parameters in combination can also be modified during the single run-through of the entire voltage progression. The operating voltage can remain constant or be additionally varied given the modulation of one or more critical parameters.

The defect locating can occur such that the laser beam is directed to a single scan point and that it remains positioned at this scan point until a critical parameter or until a plurality of critical parameters in combination have been modified over a respective, defined modulation range. The defect locating, however, can also occur such that: the critical parameters have respective fixed values allocated to them; the integrated circuit is then swept with the laser beam; a critical parameter or a plurality of critical parameters in combination are then modified; the integrated circuit is again swept with the laser beam; and the critical parameters are modified and the integrated circuit is always scanned anew by the laser beam until, given a specific combination of critical parameters, or given a specific critical parameter, a malfunction of the circuit occurs and the location of the defect is localized via the scan point just scanned by the laser beam.

When the defect is to be located such that the critical parameters or a critical parameter receives a fixed value, and the integrated circuit or a part of an integrated circuit is then scanned, then it should be assured that, at every scan point of the laser beam in this scanning, a voltage progression existing at this scan point is run-through at least once.

In order to discover defects which relate to the chronological sequence of logic statuses, the following critical parameters can be modulated given pulse-like signal progressions at the respective scan points of the laser beam: repetition rate of the pulses of the voltage progression; decay and rise time of the pulses of the voltage progression; amplitudes of the pulses of the voltage progression; a DC voltage superimposed on the pulses of the voltage progression; and the phases of the pulses of the voltage progression, etc.

In order to localize defects which are temperature-dependent, or which only appear in electrical or magnetic fields, the temperature can be modulated or the electrical and/or magnetic field strength can be modulated. As a result of modulation of radiation which impinges specific regions, regions which react sensitively to radiations can also be localized. Useful here as radiation are ultraviolet radiation, x-radiation, alpha radiation, etc.

The evaluation concerning the degree to which an electrical circuit is functional preferably occurs via the output signal of the investigated electrical circuit. However, it is also conceivable that individual electrical circuits are subjected in manufacturing tests to a method of the invention. Various parameters are thus modulated over a defined modulation range. Signals which contain information with respect to the logical function of scan points during or after the modulation of parameters are stored in some form within the electrical circuit. Finally, a final signal formed from these signals can be called from the electrical circuit, this final signal containing information regarding whether the tested circuit meets specific specifications or not.

A method of the invention can, for example, also be executed such that: an electrical circuit is at least partially scanned with the laser beam; a critical parameter or a plurality of critical parameters are modified within a defined modulation range at every scan point; a check is executed to see whether an error occurs when these critical parameters have values within this modulation range; and finally, at the next scanning of the electrical circuit, the critical parameters are modulated such that at least one critical parameter is modified within a different modulation range.

The modulation ranges or the dwell of the laser beam at a specific scan point over a specific plurality of run-throughs of the voltage progression must thereby be selected such that the cause of a fault at a specific scan point can be allocated to a specific value range of critical parameters.

DESCRIPTION OF THE PREFERRED EMBODIMENTS

A laser scanner as disclosed in U.S. Pat. No. 4,407,008, incorporated herein by reference, can be employed for the implementation of a method of the invention and for constructing an apparatus of the invention.

Figure 1:
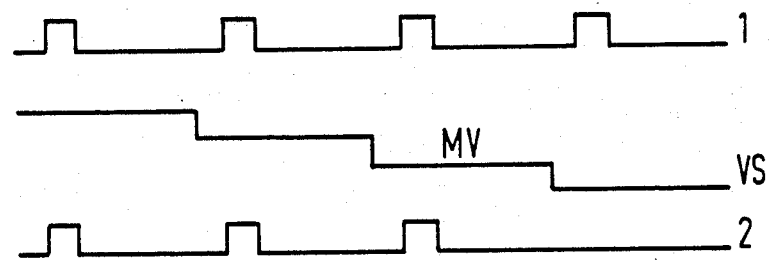
FIG. 1 explains the principle of "marginal voltage measurement" according to the prior art.

FIG. 1 illustrates a prior art method for a "marginal voltage measurement". An input of an electrical circuit whose function is to be checked is driven with a pulse-shaped voltage 1 which periodically repeats (periodically repeating waveform). The operating voltage VS of the circuit to be checked is lowered by a discrete value after every period of the voltage 1. As long as the operating voltage VS of the electrical circuit to be checked is greater than or equal to a specific value MV (marginal voltage), an output of the circuit to be checked exhibits a fault-free progression of an output voltage 2. It is assumed in the presentation of the method according to the prior art in FIG. 1 that the output signal voltage 2 should likewise have a periodic, pulse-shaped progression (periodically repeating waveform), at least as long as the progression of the output voltage 2 is error-free. When the operating voltage VS is reduced below the specific value MV, an error occurs in the function of the electrical circuit to be checked. The error in the function of the electrical circuit can be documented on the progression of the output signal voltage 2 because, when the operating voltage VS exhibits a value lower than the value MV, the output signal voltage 2 shows a faulty progression.

The concept of a marginal voltage for the operating voltage VS at which an electrical circuit to be checked just still functions can be applied given both combinational as well as sequential logic elements.

When the operating voltage VS is lowered only at those times at which an input voltage 1 is experiencing no voltage modification, that value MV for the minimum voltage of the operating voltage VS which is necessary in order to obtain a now existing logical status fault-free can be identified. When the operating voltage VS is lowered at a point in time at which an input voltage 1 is experiencing a voltage modification, that value MV for the minimum voltage of the operating voltage VS necessary for logic status changes to sequence error-free can be determined.

In principle, three different values MV for the minimum voltage of the operating voltage VS can be specified: a "permanent" value MV at which error-free data are just still maintained within sequential circuits such as, for example, within memories and within shift registers; a "dynamic" value MV at which dynamic voltage changes just still sequence error-free; and an "immediate" value MV below which logic errors appear in a combinational circuit, these logic errors being immediately and directly linked to signal values at an output of the electrical circuit.

Figure 2:
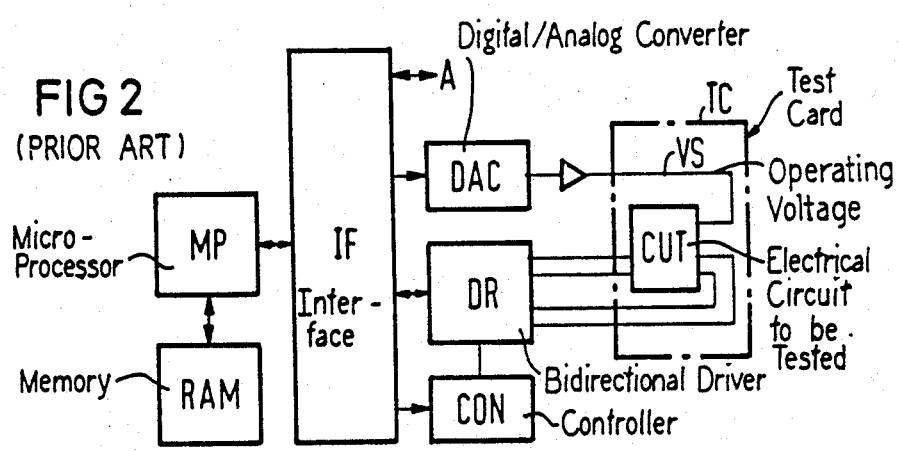
FIG. 2 shows a block circuit diagram for an apparatus for the implementation of a prior art method explained with reference to FIG. 1.

FIG. 2 shows an apparatus for the implementation of a method of the prior art as has been explained with reference to FIG. 1. The test execution is controlled by a microprocessor MP. A test program for each electrical circuit CUT to be tested is contained in a write-read memory RAM which is connected to the microprocessor MP. The test results can also be finally deposited in this memory RAM. A control software for editing the test program into a form suitable for the microprocessor MP can also be contained in this memory RAM. The test program defines the sequence of logical input statuses at the input of the electrical circuit CUT. Via the input/output interface IF, the test program places the bidirectional driver DR into the required operating condition. Signals are output via the driver DR to the inputs of the electrical circuit CUT and signals are accepted from the outputs of the electrical circuit CUT. The supply and load circuits which define the logical signal level at the inputs and outputs of the electrical circuit CUT are secured alongside the electrical circuit CUT on a universally employable test card TC. The test card TC comprises plugs onto which the electrical circuit CUT is plugged.

The variable operating voltage VS is generated via a 12 BIT digital-to-analog converter DAC. The variable operating voltage VS is controlled by the microprocessor MP. The successive values of the operating voltage VS are defined dependent on the preceding test results.

The direction of the data in the driver DR is controlled via a controller means CON. The test results can be output via an output A of the interface IF to a printer or to some other output device.

Figure 3:
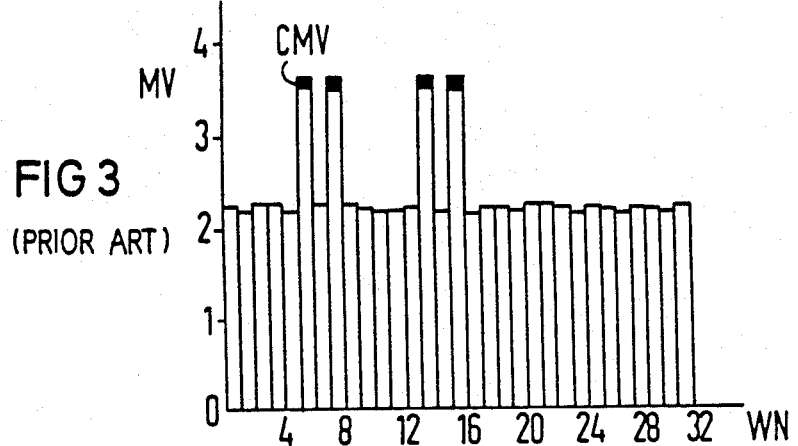
FIG. 3 shows the result of a prior art method explained with reference to FIG. 1.

FIG. 3 explains the change CMV in the minimum voltage (marginal voltage) when a light beam impinges a weak point within the electrical circuit CUT. When a 2-bit adder has five inputs, it comprises 32 different values for the value MV of the "immediate" marginal voltage described in greater detail above. The 32 various values are specified in FIG. 3 as word number WN. Given the word numbers 6, 8, 14, and 16, anomalous values MV derive for the marginal voltage. A binary word which corresponds to one of the four anomalous values MV for the marginal voltage is statically applied to the inputs of the combinational circuit while a light beam scans the combinational circuit. When the light beam then impinges the weak point which causes the anomalous values MV, photon-induced charge carriers are generated in the environment of the weak point and produce a slight change in the electrical characteristic of the combinational circuit. As a result thereof, a slight change CMV is effected at the anomalous values MV. That weak point at which the technological defect exists is localized in this fashion.

Figure 4:
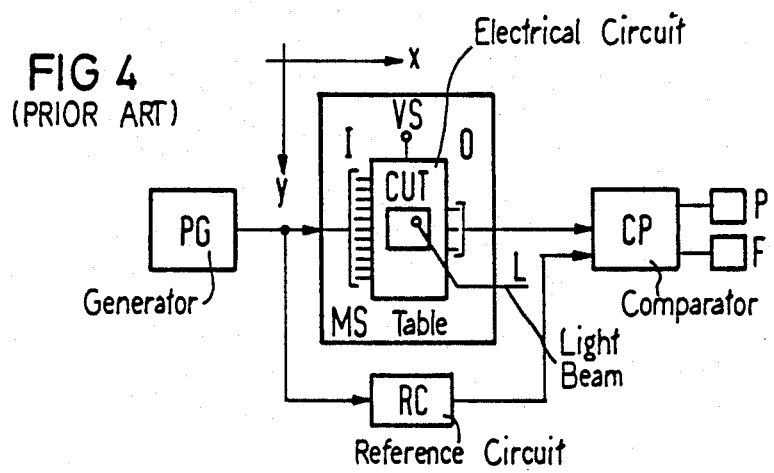
FIG. 4 explains a prior art method.

FIG. 4 shows an apparatus for the implementation of a method which was explained with reference to FIG. 3. A generator PG generates a check bit pattern which is applied to the inputs I of a circuit CUT under test and to the inputs of a reference circuit RC. The signal from the outputs O of the circuit CUT under test, and the signals from the outputs of the reference circuit RC, proceed to a comparator CP in which the output signals of the circuit CUT under test are compared to the output signals of the reference circuit RC. When the respective output signals coincide, the signal P is activated. When the respective output signals do not coincide, the output signal F is activated. A light beam L can be positioned to every point of the circuit CUT under test. The circuit CUT under test is supplied with the variable operating voltage VS. The circuit CUT under test is, for example, positioned on the table MS of a laser scanning microscope.

FIG. 4 shows the test of a combinational circuit. The test of a sequential circuit occurs in a similar fashion. When the light beam L impinges a weak point inside a sequential circuit, the logic function of the sequential circuit is disrupted.

In practice, a plurality of regions which cause anomalous values MV of a marginal voltage upon incidence of the light beam frequently occur. The anomalous values MV can be larger or smaller than the values MV to be anticipated given a good circuit. All of those regions which react to the incidence of the light beam L are practically always in a physical and electrical connection to the true weak points. Since the degree of the change CMV of the minimum voltage depends on the nature of the weak point, the true weak point can be discovered since the light beam L is fucused as highly as possible. The true weak point lies where the change CMV in the value of the marginal voltage is greatest.

An apparatus of FIG. 4 can be automated without further effort. The various values MV for the marginal voltage can be measured at every scan point within the circuit CUT under test. The scanning of the electrical circuit CUT under test with the light beam L, the variation of the operating voltage VS, the input of signals to the electrical circuit CUT under test, and the checking of output signals of this electrical circuit CUT can all be controlled by a computer.

Figure 5:
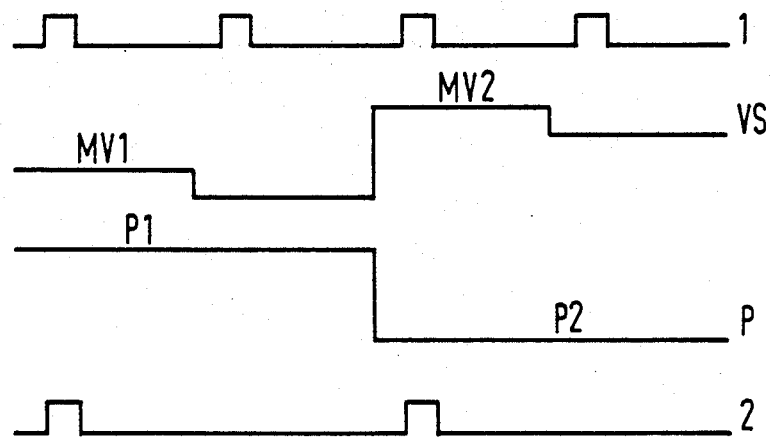
FIG. 5 explains a method of the invention.

FIG. 5 illustrates a method of the invention. In a method of the invention, it is not only defects or errors already identified within the circuit that can be located, as was explained with reference 3. In a method of the invention, weak points which do not yet induce a faulty bahavior of the electrical circuit under test without a variation of external parameters can also be located. Such weak points, however, can lead to a premature loss of functionability of a circuit under test. Such weak points are detected since one or more parameters P are varied during the test. Such parameters P can be the repetition rate of signal pulses, decay and rise time of signal pulses, amplitude of signal pulses, a DC voltage superimposed on the signal pulses, a phase of signal pulses with respect to the signal frequency, the temperature or the electrical and/or magnetic field strength, and a radiation directed onto the electrical circuit.

In the example of FIG. 5, a signal 1 is present at an input of an electrical circuit. The variable parameters P have values which can be allocated to a parameter or a parameter combination P1. At the same time, the light beam L impinges a scan point and the supply voltage VS has a value MV1. Under these conditions, then the signal 2 at an output of the electrical circuit shows that the function of the electrical circuit is error-free. As long as a value P1 of a parameter or of a parameter combination is present, a small reduction of the operating voltage VS below the value MP1 suffices such that the function of the electrical circuit is no longer faultless, as may be read from signal 2. When the value of a parameter or of a parameter combination is varied toward the value P2 while the signal 1 is present at the same input of the electrical circuit as in the example just described, and while the light beam L impinges the same scan point as in the example just described, that value of the operating voltage VS at which the circuit still just functions error-free has been modified from value MV1 to value MV2. How greatly the immediate environment of the scan point just impinged by the light beam reacts to a modification of the critical parameter P from the value combination P1 to the value combination P2, can be determined from the difference between the values MV1 and MV2. Conclusions with respect to technological weak points in the closer proximity of the scan point impinged by the light beam L can be drawn therefrom. Depending on the change of the parameter or of the parameter combination P, the value MV2 can be greater than, smaller than, or equal to the value MV1. A small reduction of the operating voltage VS given an existing parameter, or given an existing parameter combination P2 below the value MV2, again leads to the fact that the electrical circuit no longer functions faultlessly, as can be read from output signal 2.

Technological weak points that can be localized with such a method are, for example, leakage current channels, undesired capacitances, boundary layers which react greatly to temperature or to electrical or to magnetic fields in an undesired fashion, radiation-sensitive regions, locations with undesired values for the electrical resistance, etc.

Figure 6:
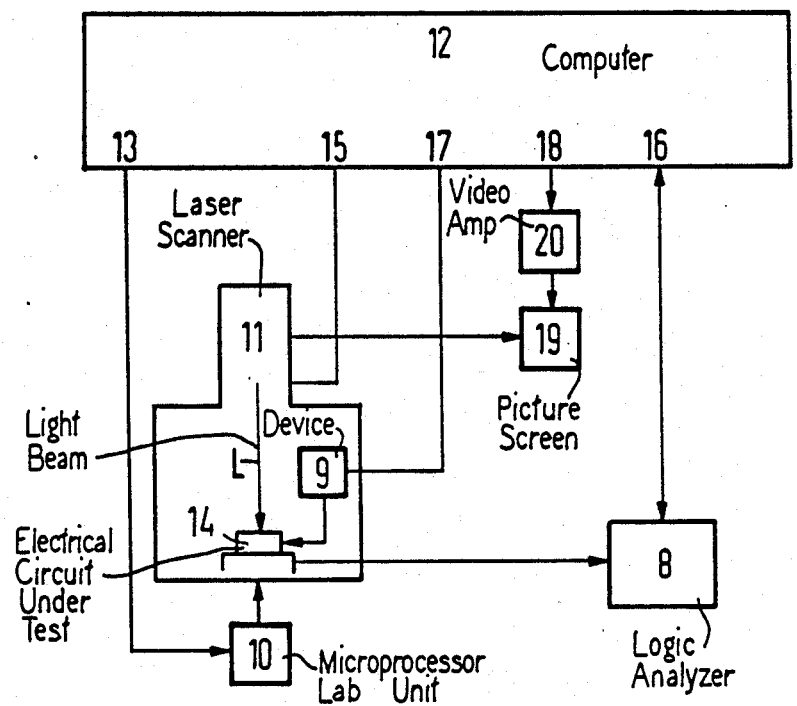
FIG. 6 shows a block circuit diagram for an apparatus of the invention.

FIG. 6 shows an apparatus for the implementation of a method of FIG. 5. The execution of the method is controlled by a computer 12 (Interdata 6/16). The positioning of the light beam L occurs in a laser scanner according to U.S. Pat. No. 4,407,008, incorporated herein by reference, with the assistance of a digital scan generator 15. The drive of a microprocessor 8085 employed as an electrical circuit 14 under test occurs by means of a microprocessor laboratory unit 10 (HP μ-Lab 5036 A). The modulation of the parameters which are variable via the drive 10—such as, for example, repetition rate, decay and rise time, amplitude, superimposed DC and phase given pulse-shaped signals—occurs via the output 13 of the computer 12. The modulation of the parameters not variable via the drive 10—such as, for example, temperature, electrical and/or magnetic field strength, radiation, etc.—occurs via a device 9 controlled via the output 17 by the computer 12. Devices 9 suitable for this purpose are well-known to a person skilled in the art. The output signals of the electrical circuit 14 proceed to a device 8 in which the output signals are evaluated. The device 8 can, for example, be a Biomation K100 logic analyzer. The measured value processing in the logic analyzer 8 is controlled via the output 16 of the computer 12. The measured results, however, can also be directly rolled into the computer employed for the job sequencing and can be evaluated therein. The measured results can also be stored in some other computer.

At least one critical parameter P is modulated at every scan point of the electrical circuit 14 impinged by the light beam L. For example, a parameter P is varied from a value P1 to a value P2. The difference between the values MV1 and MV2 of the operating voltage VS is measured, as explained with reference to FIG. 5. This difference between the values MV1 and MV2 is evaluated in the logic analyzer 8 or in the computer 12. The result of this evaluation is employed for the following. It generates an image pattern corresponding to the result of this evaluation on the picture screen 19 via the output 18 of the computer 12, and it superimposes this image pattern which indicates the technological weak points in the electrical circuit 14 on an image of the electrical circuit 14 acquired with the assistance of the laser scanner 11. The position of a faulty location in the electrical circuit 14 can be located in this fashion. A video amplifier 20 can be connected between the output 18 of the computer 12 and the picture screen 19.

Figure 7:
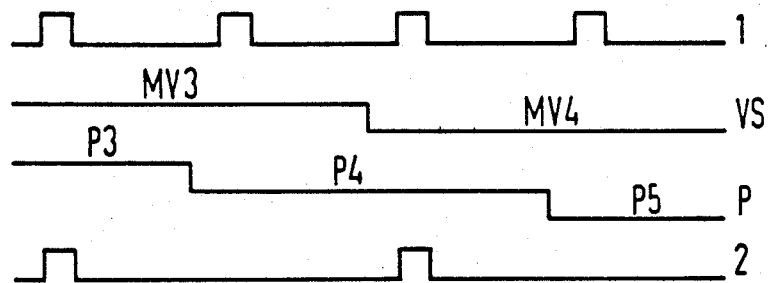
FIG. 7 illustrates a method of the invention.

FIG. 7 illustrates a further embodiment of a method of the invention. The signal 1 is again present at an input of the electrical circuit 14. The operating voltage VS is first set to a value MV3. A parameter or a parameter combination P is set to a value P3 while the operating voltage is held constant. This parameter or parameter combination P3 allows a faultless functioning of the electrical circuit 14 in combination with the value MV3 of the operating voltage VS. This may be seen from the output signal 2. While the value MV3 of the operating voltage VS is held constant, the parameter or parameter combination is now set to the value P4. The functionability of the electrical circuit 14 immediately collapses, as may be seen from output signal 2. Given a constant parameter or given a constant parameter combination P4, the value of the operating voltage VS can now be modified from the value MV3 to the value MV4. According to the example of FIG. 7, the electrical circuit 14 recovers its functionability, this again being perceptible at the output signal 2. When the operating voltage VS is maintained at the value MV4 and the parameter or the parameter combination is simultaneously set to the value P5, then the functionability of the electrical circuit 14 again collapses in the example of FIG. 7, this again being clear from the output signal 2.

In the example of FIG. 7, either the entire electrical circuit 14 can be scanned, or a few selected points can be selectively scanned. In the example of FIG. 7, also the function of the electrical circuit 14 is evaluated via the output signal at every scan point. In a specific exemplary embodiment, the result of this evaluation can again be superimposed on an image of the electrical circuit 14 acquired with the assistance of the light beam L. It is superimposed, for example, as a colored pattern. When, given incidence of the light beam L on a defective scan point, the electrical circuit 14 remains functional, it can, for example, be provided that no color hue is superimposed in the image on the picture screen 19 where this scan point is imaged. When, in contrast thereto, the electrical circuit 14 becomes unfunctional given incidence of the light beam L on a defective scan point, a differently graduated gray scale or a different color hue can be superimposed on the picture screen 19 where this scan point is imaged depending on the severity of the defect. This, for example, can be read from the modulation degree of the parameter or of the parameter combination P required for the electrical circuit 14 to become unfunctional.

The light beam L can also be pulsed. This is recommended when testing a sensitive electrical circuit wherein so many charge carriers would be released given a longer dwell of the light beam L on a scan point such that the electrical circuit would malfunction when scanning each and every scan point. Scanning a scan point with a pulsed light beam L, however, is also recommended when only one or more phase points or phase regions within a period of the voltage curve repeating at the scan point are critical, i.e. could lead to an outage of the electrical circuit. Given a periodically repeating, pulse-shaped voltage at the scan point, for example, an edge of a pulse can be critical whereas the pulse plateau of the pulse associated with the critical edge is not critical. When the scan point is stroboscopically scanned with the light beam L, critical phases or critical phase regions within a period of the voltage curve repeating at the scan point can be identified. A scan point is stroboscopically scanned when a specific voltage curve chronologically repeats at this scan point and when the light beam L directed to the scan point is always switched on only at a very specific phase within the period of the voltage curve repeating at the scan point. Such a stroboscopic method with a light beam L can be implemented in accordance with a stroboscopic method with an electron beam disclosed by U.S. Pat. No. 3,628,012, incorporated herein by reference. When, with the assistance of the stroboscopic measuring method, the signal curve periodically repeating at the scan point is scanned at different phases with respect to the period of the voltage curve repeating at the scan point, the phase with respect to the period of the signal curve repeating at the scan point can be gradually shifted in a so-called sampling method over the entire period of this repeating signal curve or over sub-regions of this repeating signal curve. Critical phases within a period of the signal curve periodically repeating at the scan point can be identified in this fashion. Such a sampling method with the light beam L can be executed in accordance with a sampling method as disclosed for an electron beam in U.S. Pat. No. 4,220,853, incorporated herein by reference.

A means for pulsing the light beam L is contained in a laser scanner 11 such as specified in U.S. Pat. No. 4,407,008, incorporated herein by reference. A synchronization of the pulsed light beam L with the voltage curve repeating at the scan point can occur via the two outputs 13 and 15 of the computer 12.

Although various minor changes and modifications might be proposed by those skilled in the art, it will be understood that I wish to include within the claims of the patent warranted hereon all such changes and modifications as reasonably come within my contribution to the art.

I claim as my invention:

1. A method for defect locating in an electrical circuit with use of a light beam, comprising steps of:
   driving at least one scan point on the electrical circuit to be analyzed for defects with a drive voltage having a periodically repeating waveform;
   supplying an operating voltage to the electrical circuit;
   directing said light beam to said at least one scan point of said electrical circuit, said light beam causing a disruption of a function of the electrical circuit at the scan point by releasing charge carriers with said light beam, said function disruption occurring when the operating voltage to the circuit is changed to a critical level;
   defining a first value for at least one critical parameter other than the operating voltage, and operating the electrical circuit by setting the operating voltage at a first level where the circuit will function without fault;
   with said critical parameter at said first value, changing the operating voltage while the light impinges the scan point so as to determine whether a fault will occur at a changed second operating voltage level, and when a fault does occur, noting said second operating voltage level;
   changing the critical parameter from said first value to a second value and operating the electrical circuit by setting the operating voltage at a third level where the circuit will function without fault; and
   with said critical parameter at said second value, changing the operating voltage while the light impinges the scan point so as to determine whether a fault will occur at another changed fourth operating voltage level, and when a fault does occur, noting said fourth operating voltage level.

2. A method according to claim 1 wherein the drive voltage with a periodically repeating waveform comprises a series of periodically repeating pulses.

3. A method according to claim 1 wherein said at least one critical parameter comprises a repetition rate of the drive voltage.

4. A method according to claim 1 wherein said at least one critical parameter comprises at least one edge of a voltage pulse of the drive voltage.

5. A method according to claim 1 wherein said at least one critical parameter comprises an amplitude of the drive voltage.

6. A method according to claim 1 wherein said at least one critical parameter comprises a DC voltage superimposed on the periodically repeating waveform of the drive voltage.

7. A method according to claim 1 wherein said at least one critical parameter comprises a phase of the drive voltage.

8. A method according to claim 1 wherein said at least one critical parameter comprises a temperature at said scan point.

9. A method according to claim 1 wherein said at least one critical parameter comprises an electrical field strength at the scan point.

10. A method according to claim 1 wherein said at least one critical parameter comprises a magnetic field strength at the scan point.

11. A method according to claim 1 wherein a radiation in addition to said light beam is radiated at said scan point while changing the operating voltage when checking for faults.

12. A method according to claim 1 including the step of pulsing the light beam when changing the operating voltage.

13. A method according to claim 1 wherein more than one critical parameter are simultaneously varied.

14. A method for defect locating in an electrical circuit with use of a light beam, comprising steps of:
   driving at least one scan point on the electrical circuit to be analyzed for defects with a drive voltage having a periodically repeating waveform;
   supplying an operating voltage to the electrical circuit;
   directing said light beam to said at least one scan point of said electrical circuit, said light beam causing a disruption of a function of the electrical circuit at the scan point by releasing charge carriers with said light beam, said function disruption occurring when a value of a critical parameter other than the operating voltage to the circuit falls below a critical level;
   defining a first value for at least one critical parameter other than the operating voltage, and operating the electrical circuit by setting the operating voltage at a first level where the circuit will function without fault;
   changing the critical parameter from the first value to a different value while maintaining the operating voltage constant and while the light impinges the scan point so as to determine whether a fault will occur at a new second value of said critical parameter, and when a fault does occur, noting said new second value of the critical parameter; and
   given presence of said fault at said critical parameter new second value, changing the operating voltage to a new second level at which the circuit operates without fault and noting said new operating voltage second level.

15. A method according to claim 14 wherein when said circuit is again operating at said new operating voltage second level at said new critical parameter second level, again changing the critical parameter to a third value where a fault again develops and noting said critical parameter third value.

* * * * *